US012696492B2

(12) United States Patent
Mattis et al.

(10) Patent No.: US 12,696,492 B2
(45) Date of Patent: Jul. 28, 2026

(54) SOLID-STATE DEVICE WITH OPTICAL WAVEGUIDE AS FLOATING GATE ELECTRODE

(71) Applicant: ORCA Computing Limited, London (GB)

(72) Inventors: Brian Mattis, Austin, TX (US); Ke Liu, Austin, TX (US); Taran Huffman, Austin, TX (US); Bryan Woo, Goleta, CA (US)

(73) Assignee: ORCA Computing Limited, London (GB)

( * ) Notice: Subject to any disclaimer, the term of this patent is extended or adjusted under 35 U.S.C. 154(b) by 553 days.

(21) Appl. No.: 17/238,553

(22) Filed: Apr. 23, 2021

(65) Prior Publication Data

US 2021/0336050 A1       Oct. 28, 2021

Related U.S. Application Data

(60) Provisional application No. 63/014,806, filed on Apr. 24, 2020.

(51) Int. Cl.
| | |
|---|---|
| *H10D 30/68* | (2025.01) |
| *G02B 6/12* | (2006.01) |
| *G02B 6/122* | (2006.01) |
| *H10B 41/30* | (2023.01) |
| *G02B 6/293* | (2006.01) |

(52) U.S. Cl.
CPC ......... *H10D 30/68* (2025.01); *G02B 6/12007* (2013.01); *G02B 6/1228* (2013.01); *H10B*
*41/30* (2023.02); *G02B 2006/12061* (2013.01); *G02B 6/2935* (2013.01)

(58) Field of Classification Search
CPC .... H10D 30/68; H10B 41/30; G02B 6/12007; G02B 6/1228; G02B 6/2935
See application file for complete search history.

(56) References Cited

U.S. PATENT DOCUMENTS

| | | | |
|---|---|---|---|
| 4,608,569 | A | 8/1986 | Dickey, Jr. et al. |
| 5,377,289 | A | 12/1994 | Johnson |
| 5,444,864 | A | 8/1995 | Smith |
| 5,578,845 | A | 11/1996 | Yoshiyuki et al. |
| 5,699,176 | A | 12/1997 | Cohen |
| 5,701,371 | A | 12/1997 | Ishida |
| RE35,736 | E | 2/1998 | Powell |
| 5,757,312 | A | 5/1998 | Szmurlo |

(Continued)

FOREIGN PATENT DOCUMENTS

| | | |
|---|---|---|
| CN | 101379718 | 3/2009 |
| CN | 101882623 B | 11/2010 |

(Continued)

OTHER PUBLICATIONS

Chinese Patent Office, Office Action, CN Patent Application No. 202180035753.4, 20 pages.

(Continued)

*Primary Examiner* — Nathan W Ha
(74) *Attorney, Agent, or Firm* — Fenwick & West LLP

(57) ABSTRACT

A semiconductor device includes a floating gate that can be charged in a nonvolatile manner. The floating gate is also structured as an optical waveguide, and maybe optically coupled to a photonic circuit, such as an interferometer.

19 Claims, 8 Drawing Sheets

300a

(56)                   References Cited

U.S. PATENT DOCUMENTS

| | | | |
|---|---|---|---|
| 5,867,293 A | 2/1999 | Kotten | |
| 5,904,546 A | 5/1999 | Wood et al. | |
| 6,359,714 B1 | 3/2002 | Imajo | |
| 6,373,909 B2 | 4/2002 | Lindquist | |
| 6,507,728 B1 | 1/2003 | Watanabe | |
| 6,539,204 B1 | 3/2003 | Marsh | |
| 6,567,648 B1 | 5/2003 | Ahn | |
| 6,567,649 B2 | 5/2003 | Souissi | |
| 6,745,018 B1 | 6/2004 | Zehavi | |
| 6,751,447 B1 | 6/2004 | Jin | |
| 6,760,454 B1 | 7/2004 | Shreve | |
| 6,771,931 B2 | 8/2004 | Waltho | |
| 6,778,319 B2 | 8/2004 | Chavez-Pirson | |
| 6,873,639 B2 | 3/2005 | Zhang | |
| 6,907,093 B2 | 6/2005 | Blount | |
| 6,999,639 B2 | 2/2006 | Tsarev | |
| 7,020,396 B2 | 3/2006 | Izadpanah | |
| 7,058,368 B2 | 6/2006 | Nicholls | |
| 7,064,697 B2 | 6/2006 | Taylor et al. | |
| 7,085,497 B2 | 8/2006 | Tiemann | |
| 7,116,484 B2 | 10/2006 | Nemoto | |
| 7,123,676 B2 | 10/2006 | Gebara | |
| 7,130,289 B2 | 10/2006 | Kuan et al. | |
| 7,355,993 B2 | 4/2008 | Adkins | |
| 7,366,244 B2 | 4/2008 | Gebara | |
| 7,446,601 B2 | 11/2008 | LeChevalier | |
| 7,496,257 B2 | 2/2009 | Levner | |
| 7,509,054 B2 | 3/2009 | Calabro et al. | |
| 7,566,634 B2 | 7/2009 | Beyne et al. | |
| 7,650,080 B2 | 1/2010 | Yap | |
| 7,660,531 B2 | 2/2010 | Lee | |
| 7,672,643 B2 | 3/2010 | Loh | |
| 7,680,368 B2 | 3/2010 | Welch et al. | |
| 7,711,329 B2 | 5/2010 | Aparin | |
| 7,720,029 B2 | 5/2010 | Orava | |
| 7,729,431 B2 | 6/2010 | Gebara | |
| 7,756,480 B2 | 7/2010 | Loh | |
| 7,778,611 B2 | 8/2010 | Asai | |
| 7,809,047 B2 | 10/2010 | Kummetz | |
| 7,826,808 B2 | 11/2010 | Faulkner | |
| 7,853,195 B2 | 12/2010 | Higgins | |
| 7,869,527 B2 | 1/2011 | Vetter | |
| 7,876,867 B2 | 1/2011 | Filipovic | |
| 7,907,895 B2 | 3/2011 | Shinagawa | |
| 7,917,177 B2 | 3/2011 | Bauman | |
| 8,036,606 B2 | 10/2011 | Kenington | |
| 8,055,235 B1 | 11/2011 | Gupta et al. | |
| 8,078,130 B2 | 12/2011 | Fudge | |
| 8,081,946 B2 | 12/2011 | Fudge | |
| 8,098,779 B2 | 1/2012 | Komninakis et al. | |
| 8,155,605 B2 | 4/2012 | Hwang | |
| 8,170,487 B2 | 5/2012 | Sahota et al. | |
| 8,233,872 B2 | 7/2012 | Nagai | |
| 8,249,540 B1 | 8/2012 | Gupta | |
| 8,270,843 B2 | 9/2012 | Nakamoto | |
| 8,299,555 B2 | 10/2012 | Su et al. | |
| 8,320,504 B2 | 11/2012 | Peng | |
| 8,331,509 B2 | 12/2012 | Wang | |
| 8,351,874 B2 | 1/2013 | Dent | |
| 8,477,871 B2 | 7/2013 | Neumann | |
| 8,521,090 B2 | 8/2013 | Kim | |
| 8,526,903 B2 | 9/2013 | Gudem | |
| 8,565,681 B2 | 10/2013 | Kim | |
| 8,600,200 B1 | 12/2013 | Rakich et al. | |
| 8,618,966 B2 | 12/2013 | Kanter | |
| 8,682,170 B2 | 3/2014 | Prucnal | |
| 8,693,810 B2 | 4/2014 | Suarez et al. | |
| 8,730,786 B2 | 5/2014 | Wang | |
| 8,781,030 B2 | 7/2014 | Peng | |
| 8,785,332 B2 | 7/2014 | Johnson et al. | |
| 8,805,298 B2 | 8/2014 | McCallister | |
| 8,845,854 B2 | 9/2014 | Lei et al. | |
| 8,867,928 B2 | 10/2014 | Piehler | |
| 8,872,583 B2 | 10/2014 | Lee | |
| 8,971,712 B2 | 3/2015 | Fan et al. | |
| 8,977,223 B1 | 3/2015 | Gupta | |
| 9,020,307 B2 | 4/2015 | Ishikawa | |
| 9,077,440 B2 | 7/2015 | Wyville | |
| 9,100,099 B2 | 8/2015 | Loh | |
| 9,106,453 B2 | 8/2015 | Wang | |
| 9,159,635 B2 * | 10/2015 | Elolampi | H05K 1/0326 |
| 9,160,386 B2 | 10/2015 | Rimini | |
| 9,178,635 B2 | 11/2015 | Ben-Shlomo | |
| 9,184,902 B2 | 11/2015 | Khojastepour | |
| 9,195,052 B2 | 11/2015 | Long | |
| 9,214,718 B2 | 12/2015 | Mow | |
| 9,224,650 B2 | 12/2015 | Lei et al. | |
| 9,252,857 B2 | 2/2016 | Negus | |
| 9,253,003 B1 | 2/2016 | Harel | |
| 9,257,811 B2 | 2/2016 | Gao | |
| 9,258,052 B2 | 2/2016 | George | |
| 9,268,092 B1 | 2/2016 | Jarecki, Jr. | |
| 9,312,895 B1 | 4/2016 | Gupta | |
| 9,344,125 B2 | 5/2016 | Kpodzo | |
| 9,344,139 B2 | 5/2016 | Sjoland | |
| 9,385,268 B2 | 7/2016 | Minamiru et al. | |
| 9,391,667 B2 | 7/2016 | Sundstrom | |
| 9,438,288 B2 | 9/2016 | Feld | |
| 9,450,623 B2 | 9/2016 | Weissman | |
| 9,490,963 B2 | 11/2016 | Choi | |
| 9,503,134 B2 | 11/2016 | Sadek et al. | |
| 9,520,983 B2 | 12/2016 | Choi et al. | |
| 9,520,985 B2 | 12/2016 | Choi | |
| 9,571,205 B1 | 2/2017 | Suarez | |
| 9,589,812 B2 | 3/2017 | Takahashi et al. | |
| 9,602,149 B1 | 3/2017 | Tanzi | |
| 9,608,718 B2 | 3/2017 | Monsen | |
| 9,651,652 B2 | 5/2017 | Kpodzo et al. | |
| 9,667,404 B2 | 5/2017 | Sjoland | |
| 9,696,492 B1 | 7/2017 | Cox | |
| 9,698,913 B2 | 7/2017 | Foster | |
| 9,703,046 B2 | 7/2017 | Paquet | |
| 9,703,056 B2 | 7/2017 | Neelakantan et al. | |
| 9,712,233 B1 | 7/2017 | Deng | |
| 9,722,713 B2 | 8/2017 | Tanzi | |
| 9,723,612 B2 | 8/2017 | Stapleton | |
| 9,726,821 B2 | 8/2017 | Murray et al. | |
| 9,735,056 B2 | 8/2017 | Takahashi et al. | |
| 9,748,906 B2 | 8/2017 | Stewart | |
| 9,768,852 B2 | 9/2017 | Ling | |
| 9,774,364 B2 | 9/2017 | Shih | |
| 9,775,123 B2 | 9/2017 | Harel | |
| 9,793,943 B2 | 10/2017 | Sjoland | |
| 9,793,992 B2 | 10/2017 | Hino | |
| 9,807,700 B2 | 10/2017 | Harel | |
| 9,831,898 B2 | 11/2017 | Pratt | |
| 9,847,258 B2 | 12/2017 | Rohleder et al. | |
| 9,871,552 B2 | 1/2018 | Din | |
| 9,885,806 B2 | 2/2018 | Steinhardt | |
| 9,885,825 B2 | 2/2018 | Kopp | |
| 9,887,862 B2 | 2/2018 | Zhou et al. | |
| 9,900,044 B2 | 2/2018 | Sjoland | |
| 9,911,743 B2 * | 3/2018 | Bertin | G11C 13/025 |
| 9,923,593 B2 | 3/2018 | Andersson | |
| 9,923,708 B2 | 3/2018 | Khandani | |
| 9,948,377 B1 | 4/2018 | Kim et al. | |
| 9,960,805 B2 | 5/2018 | Wyville | |
| 9,960,850 B2 | 5/2018 | Daniel | |
| 9,967,014 B1 | 5/2018 | Park et al. | |
| 9,973,282 B2 | 5/2018 | Welch | |
| 9,997,363 B2 | 6/2018 | Ono et al. | |
| 10,009,120 B2 | 6/2018 | Ranson | |
| 10,027,465 B2 | 7/2018 | Sjoland | |
| 10,031,246 B2 | 7/2018 | Zhou | |
| 10,038,471 B2 | 7/2018 | Chang | |
| 10,041,028 B2 | 8/2018 | Sim et al. | |
| 10,064,217 B2 | 8/2018 | Rajagopal et al. | |
| 10,084,506 B2 | 9/2018 | Sjoland | |
| 10,110,306 B2 | 10/2018 | Jain et al. | |
| 10,133,145 B2 * | 11/2018 | Song | G02F 1/3133 |
| 10,177,836 B2 | 1/2019 | Hong | |
| 10,187,158 B2 | 1/2019 | Kikuchi | |
| 10,191,217 B2 | 1/2019 | Boutami | |
| 10,257,746 B2 | 4/2019 | Jain et al. | |

(56) References Cited

U.S. PATENT DOCUMENTS

| | | | |
|---|---|---|---|
| 10,284,367 B1 | 5/2019 | Le Ngoc | |
| 10,321,357 B1 | 6/2019 | Jain et al. | |
| 10,325,861 B2 | 6/2019 | Miccoli | |
| 10,341,028 B2 | 7/2019 | Kanter | |
| 10,356,782 B2 | 7/2019 | Negus | |
| 10,367,584 B2 | 7/2019 | Rakich | |
| 10,418,775 B2 | 9/2019 | Gao | |
| 10,439,287 B2 | 10/2019 | Ashrafi | |
| 10,491,313 B2 | 11/2019 | Jain | |
| 10,656,350 B2 | 5/2020 | Chen et al. | |
| 10,663,663 B2 | 5/2020 | Painchaud | |
| 10,673,519 B2 | 6/2020 | Hong | |
| 10,727,945 B1 | 7/2020 | Nguyen et al. | |
| 10,754,091 B1 | 8/2020 | Nagarajan | |
| 10,861,888 B2* | 12/2020 | Na | H04N 25/78 |
| 10,873,877 B2 | 12/2020 | Jain et al. | |
| 10,886,312 B2* | 1/2021 | Na | H10F 39/197 |
| 11,032,005 B2 | 6/2021 | Vishwanath et al. | |
| 11,032,737 B2 | 6/2021 | Jain et al. | |
| 11,159,498 B1 | 10/2021 | Mattis et al. | |
| 11,330,591 B2 | 5/2022 | Raghothaman et al. | |
| 11,469,821 B2 | 10/2022 | Jain et al. | |
| 2002/0139989 A1* | 10/2002 | Matsuyama | H01S 5/227 438/22 |
| 2002/0196649 A1* | 12/2002 | Song | H10D 30/68 257/E27.103 |
| 2003/0161637 A1 | 8/2003 | Yamamoto | |
| 2004/0151238 A1 | 8/2004 | Masenten | |
| 2004/0264610 A1 | 12/2004 | Marro | |
| 2008/0237591 A1 | 10/2008 | Leedy | |
| 2011/0065408 A1 | 3/2011 | Kenington | |
| 2011/0065409 A1 | 3/2011 | Kenington | |
| 2011/0079796 A1* | 4/2011 | Wober | H10F 55/155 257/89 |
| 2011/0114995 A1* | 5/2011 | Ahn | H10H 20/822 257/E33.037 |
| 2011/0134810 A1 | 6/2011 | Yamamoto et al. | |
| 2011/0227116 A1* | 9/2011 | Saito | H01S 5/125 257/E31.011 |
| 2012/0168842 A1* | 7/2012 | Wang | H10B 41/00 257/E27.06 |
| 2012/0231594 A1* | 9/2012 | Wang | H10D 30/681 438/266 |
| 2013/0295980 A1 | 11/2013 | Reuven | |
| 2014/0091281 A1* | 4/2014 | Cheng | H01L 21/76251 977/773 |
| 2014/0169236 A1 | 6/2014 | Choi | |
| 2014/0177660 A1 | 6/2014 | Elmaanaoui | |
| 2014/0223086 A1* | 8/2014 | Pavlov | G06F 12/0246 711/151 |
| 2015/0214425 A1* | 7/2015 | Taylor | H01S 5/3054 257/14 |
| 2016/0103341 A1 | 4/2016 | Long | |
| 2016/0155839 A1* | 6/2016 | Strachan | H10D 30/023 257/29 |
| 2017/0176780 A1 | 6/2017 | Levy et al. | |
| 2018/0006795 A1 | 1/2018 | Raaf | |
| 2018/0248627 A1 | 8/2018 | Daniel | |
| 2018/0254317 A1* | 9/2018 | Pohlman, III | H10D 1/692 |
| 2019/0198999 A1 | 6/2019 | Ashrafi | |
| 2019/0312158 A1* | 10/2019 | Chen | H10F 39/8037 |
| 2019/0378933 A1* | 12/2019 | Inoue | H01L 21/02565 |
| 2020/0020709 A1* | 1/2020 | Lin | G11C 29/006 |
| 2020/0140337 A1* | 5/2020 | Inoue | C23C 14/3414 |
| 2020/0168701 A1* | 5/2020 | Lin | H10D 62/115 |
| 2020/0209476 A1 | 7/2020 | Mattis et al. | |
| 2020/0251610 A1* | 8/2020 | Dülk | A61B 5/0066 |
| 2020/0304253 A1 | 9/2020 | Choi et al. | |
| 2020/0305159 A1 | 9/2020 | Raghothaman et al. | |
| 2020/0321255 A1* | 10/2020 | Lin | H01L 22/34 |
| 2021/0036779 A1 | 2/2021 | Nguyen et al. | |
| 2021/0088724 A1 | 3/2021 | Liu et al. | |
| 2021/0126669 A1 | 4/2021 | Roberts et al. | |
| 2021/0153073 A1 | 5/2021 | Hain et al. | |
| 2021/0297156 A1 | 9/2021 | Jain et al. | |
| 2022/0043211 A1 | 2/2022 | Mattis et al. | |
| 2022/0199784 A1* | 6/2022 | Kawashima | H10D 12/211 |
| 2022/0238671 A1* | 7/2022 | Liu | H10B 41/35 |
| 2022/0263529 A1 | 8/2022 | Kokel et al. | |
| 2023/0015299 A1* | 1/2023 | Ware | G06N 10/00 |
| 2024/0008271 A1* | 1/2024 | Mattis | H10B 41/40 |
| 2024/0184182 A1* | 6/2024 | Cheung | G02F 1/2257 |

FOREIGN PATENT DOCUMENTS

| | | |
|---|---|---|
| CN | 104484852 | 4/2015 |
| CN | 107402489 A | 11/2017 |
| EP | 3561561 | 10/2019 |
| GB | 2139374 | 11/1984 |
| JP | 2002214461 | 7/2002 |
| JP | 2004048200 | 2/2004 |
| JP | 2006301415 | 11/2006 |
| JP | A 2011120120 | 6/2011 |
| JP | A 2013110510 | 6/2013 |
| RU | 2474056 | 1/2013 |
| WO | WO 06/072086 | 7/2006 |
| WO | WO 07/092767 | 8/2007 |
| WO | WO 08/036356 | 3/2008 |
| WO | WO 12/112357 | 8/2012 |
| WO | WO 16/118079 | 7/2016 |

OTHER PUBLICATIONS

Chang et al., "Full-duplex spectrum sensing in cognitive radios using optical self-interference cancellation," 2015 9th International Conference on Sensing Technology (ICST), IEEE, pp. 341-344, Dec. 8, 2015.

IBM, "Silicon Nanophotonic Packaging," https://researcher.watson. ibm.com/researcher/view_group_subpage.php?id=5522, Jul. 2016.

Li et al., "Multimode silicon photonics," Nanophotonics, vol. 8, No. 2, pp. 227-247, May 16, 2019.

Mothe et al., "Multichannel Microwave Photonics Signals Summation Device," *IEEE Photonics Technology Letters*, vol. 3, No. 3, pp. 140-142, Feb. 1, 2011.

Velha et al., "Simultaneous data transmissions on engineered closely packed silicon-on-insulator waveguide arrays," 19th International Conference on Transparent Optical Networks (ICTON), IEEE, pp. 1-4, Jul. 2, 2017.

Tang et al., "System limitations due to channel cross-coupling in a highly parallel polymer-based single-mode channel waveguide array," Advances in Resistive Technology and Processing XVI, vol. 2042, 12 pages, Aug. 16, 1993.

Tartaret-Josnière et al., "Microwave Photonics Summation Device with up to 19 Input Signals in K and Ku Bands," *Journal of Lightwave Technology*, vol. 34, No. 20, pp. 4715-4721, Oct. 15, 2016.

Yoo et al., "Heterogeneous 2D/3D photonic integrated microsystems," *Microsystems & Nanoengineering*, 2, 16030, Aug. 2016.

International Search Report and Written Opinion dated Jul. 12, 2021, PCT/US2021/028804, 10 pages.

Kwak, MyoungJun, "The Impact of Loop Filter in Phase Locked Loop," Bachelor's Thesis Metropolia University of Applied Sciences, Feb. 19, 2019, 50 pages.

Lecture 150—Phase Noise—I (Jun. 20, 2003), P.E. Allen 2003, 2 pages.

Mokhtari-Koushyar et al., "Nonlinear Distortions Induced by Coherent Combinations in Microwave Photonic Links," 2019 IEEE, Global Communications Conference, Dec. 9-13, 2019, 6 pages.

Mokhtari-Koushyar et al., "Laser Diode Chirp Requirements in Wideband Analog Photonic Signal Processing," 2020 IEEE, Optical fiber Communications Conference and Exhibition, Mar. 8-12, 2020, 3 pages.

Skyworks AN279, "Estimating Period Jitter from Phase Noise," Skyworks Solutions, Inc., Sep. 21, 2021, 8 pages.

(56) References Cited

OTHER PUBLICATIONS

Amiri, I.S. et al., "W-Band OFDM Transmission for Radio-Over-Fiber Link Using Solitonic Millimeter Wave Generated by MRR" (Aug. 2014) IEEE Journal of Quantum Electronics 50(8): 622-628.

Amiri, I.S. et al., "2X2 MIMO-OFDM-RoF generation and transmission of double V-Band signals using a microring resonator system" (Dec. 12, 2015) Optical and Quantum Electronics, Springer US, NY vol. 48:1 1-15.

Blumenthal, D.J., "Photonic integration for UV to IR applications" (2020) APL Photonics 5: 020903 (12 pages).

Huffman, T.A. et al., "Integrated Resonators in an Ultralow Loss Si3N4/SiO2 Platform for Multifunction Applications" (Jul./Aug. 2018) IEEE Journal of Selected Topics in Quantum Electronics vol. 24, No. 4 (9 pages).

Quan et al., "A Novel Phase Noise Mitigation Method for Full-Duplex Transceivers" 2019 11th International Conference on Wireless Communications and Signal Processing (WCSP) IEEE Oct. 23, 2019 pp. 1-6.

Sahai et al., "Understanding the Impact of Phase Noise on Active Cancellation in Wireless Full-Duplex" Asilomar Conference on Signals, Systems and Computers Conference Record, IEEE Computer Society pp. 29-33 Nov. 12, 2012.

Syrjälä et al., "Analysis of Oscillator Phase-Noise Effects on Self-Interference Cancellation in Full-Duplex OFDM Radio Transceivers" IEEE Transactions on Wireless Communications vol. 13, No. 6, pp. 2977-2990 Jun. 6, 2014.

Zhu, D. et al., "Integrated photonics on thin-film lithium niobate" (Feb. 23, 2021) arxiv.org, Cornell University Library, 201 Olin Library Cornell University Ithaca, NY 14853 (94 pages).

Wikipedia, "Field-effect transistor," Last edited Apr. 17, 2020, 13 pages, Retrieved from the internet <URL:https://en.wikipedia.org/w/index.php?title=Field-effect_transistor&oldid=951541568>.

European Patent Office, Extended European Search Report and Written Opinion, European Patent Application No. 23189923.8, Nov. 13, 2023, 12 pages.

* cited by examiner

200a 202 204 206

200b 202 208 204 210 206

400

402

500

SELECT OPTICAL MEMORY CELL ~502

DRIVE CONTROL GATE OF MEMORY CELL TO CHANGE WAVEGUIDE CHARGE STATE ~504

VERIFY CHARGE STATE BY ELECTRICAL TEST SIGNAL ~506

600

SET STATE OF MEMORY CELL ~602

OPERATE OPTICAL CIRCUIT
OPTICALLY COUPLED THROUGH
FLOATING GATE OF MEMORY CELL ~604

SOLID-STATE DEVICE WITH OPTICAL WAVEGUIDE AS FLOATING GATE ELECTRODE

CROSS-REFERENCE TO RELATED APPLICATION(S)

This application is a nonprovisional of, and claims the benefit under 35 U.S.C. § 119 of, U.S. Provisional Patent Application No. 63/014,806 filed on Apr. 24, 2020, and entitled "Floating Gate Waveguide Nonvolatile Optical Switching," the content of which is incorporated by reference in its entirety.

TECHNICAL FIELD

Embodiments described herein relate to solid-state devices that include one or more optical waveguides configured as floating gates for nonvolatile storage of electrical charge.

BACKGROUND

Semiconductor devices can include a floating gate that can be electrically charged or discharged via quantum mechanical tunneling through an insulator layer. More specifically, a control gate electrode, disposed over the insulator layer, can be driven to a specified voltage to induce or remove charge carriers from the floating gate. In these constructions, the charge state of the floating gate can be used as nonvolatile memory for a digital circuit.

In some applications, a photonic circuit may be selected to replace a semiconductor circuit to reduce power consumption and/or improve performance. A photonic circuit can include a number of optical waveguides configured to direct light to, and between, one or more passive or active optical circuits, photonic circuits, delay loops, input/output facets, and so on. Conventional photonic circuits, however, are incapable of being implemented as nonvolatile memory.

SUMMARY

Embodiments described herein can take the form of a semiconductor device including at least a source electrode, a control electrode, an insulator layer, and a floating gate separated from the source electrode and the control electrode by the insulator layer. For constructions described herein, the floating gate is an optical waveguide optically coupled to a photonic circuit.

In these constructions, the floating gate can be charged or discharged through the insulator layer via quantum tunneling (e.g., Fowler-Nordheim tunneling and/or hot carrier injection). As a result of electrical isolation of the floating gate due to the insulator layer, the floating gate retains its charged or uncharged state in a nonvolatile manner.

As noted above, for constructions described herein, the floating gate also functions as an optical waveguide. As may be known to a person of skill in the art, presence or absence of electrical charge in an optical waveguide influences an index of refraction of that optical waveguide. As a result of this optoelectric effect, the refractive index of the optical waveguide/floating gate is different between a charged state or an uncharged state of the floating gate. Further, because the charged state or uncharged state of the floating gate is nonvolatile, the index of refraction of the optical waveguide is also modifiable/mutable in a nonvolatile manner. In this way, the optical waveguide can function as a portion of a nonvolatile optical switch.

More generally and broadly, constructions described herein can be leveraged to form nonvolatile memory cells for photonic circuits.

Related and additional embodiments may include a configuration in which the insulator layer includes a first portion separating the source electrode form the floating gate and a second portion separating the control electrode from the floating gate. The first and second portions can be formed to different thicknesses to encourage charge to remain in the floating gate/optical waveguide. In other cases, the second portion of the insulator layer may be an oxide-nitride-oxide dielectric layer.

In some constructions, the photonic circuit including the optical waveguide includes an interferometer, such as a Mach-Zehnder interferometer. In these examples, a charge state of the optical waveguide/floating gate either introduces, or does not introduce, a phase shift in light passing therethrough (e.g., infrared light).

By branching light input to the photonic circuit through two or more paths, one of which passes through the optical waveguide/floating gate, and recombining those paths at one or more outputs, any phase shift introduced by the optical waveguide/floating gate causes constructive or destructive interference at the recombined output(s), determining how much light each outputs. In a simpler phrasing, the charge state of the floating gate controls, in a nonvolatile manner, how (or whether) light passes through the photonic circuit.

Embodiments described herein can also take the form of a semiconductor device including at least a conductive element, a layered dielectric disposed below the conductive element, and a silicon waveguide formed to interface a silicon oxide layer of the layered dielectric. As with other examples, the silicon waveguide can be optically coupled to a photonic circuit (such as a Mach-Zehnder interferometer, a ring resonator, and so on).

Also, as with other embodiments described herein, the silicon waveguide can be conductively decoupled from the conductive element. As a result of this construction, in response to a voltage applied to the conductive element, the silicon waveguide accumulates charge by quantum tunneling that effects a change in a refractive index of the silicon waveguide. This change in refractive index can be used as nonvolatile optical memory and/or a nonvolatile optical switch. In higher-order constructions, semiconductor devices such as described herein can be leveraged in silicon and/or photonic circuits, such as memory cells, field-programmable photonic gate arrays, and so on. Any suitable photonic circuit, of any suitable complexity or scale, can be implemented to leverage the systems and methods described herein.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1:
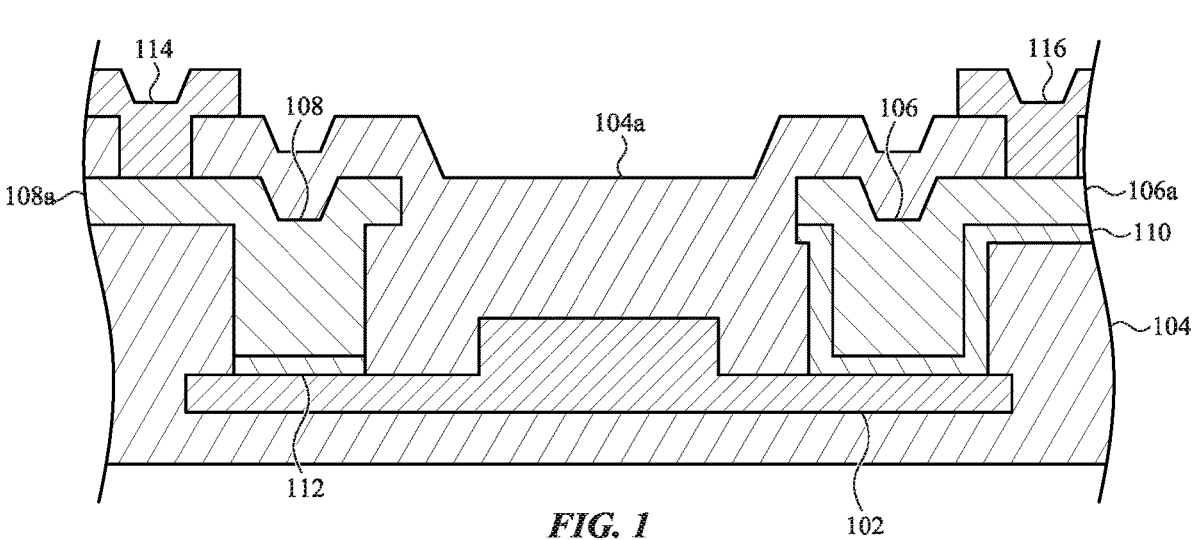
FIG. 1 depicts a simplified cross section of a nonvolatile programmable passive optical structure for a photonic circuit, such as described herein.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Certain accompanying figures include or imply vectors, rays, traces and/or other visual representations of one or more example paths—which may include reflections, refractions, diffractions, and so on, through one or more mediums—that may be taken by, or may be presented to represent, one or more photons, wavelets, or other propagating electromagnetic energy originating from, or generated by, one or more light sources shown or, or in some cases, omitted from, the accompanying figures.

It is understood that these simplified visual representations of light or optical paths or, more generally, electromagnetic energy or waveguides for the same, regardless of spectrum (e.g., ultraviolet, visible light, infrared, and so on), are provided merely to facilitate an understanding of the various embodiments described herein and, accordingly, may not necessarily be presented or illustrated to scale or with angular precision or accuracy, and, as such, are not intended to indicate any preference or requirement for an illustrated embodiment to receive, emit, reflect, refract, focus, and/or diffract light at any particular illustrated angle, orientation, polarization, color, or direction, to the exclusion of other embodiments described or referenced herein.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein relate to phonic circuits and structures having optical properties that are stable, and nonvolatile, in two or more states. Such structures can be leveraged by a photonic circuit for nonvolatile field configuration or nonvolatile storage, such as in one or more optical memory cells, one or more arrays of memory cells, one or more configurable logic blocks of a field-programmable gate array, one or more bistable switch elements, and so on.

More generally, a person of skill in the art may readily appreciate that an optical element that exhibits an electrically-programmable, nonvolatile, optical property can be used in countless ways in both photonic and electronic circuits.

Further, because such properties are nonvolatile, photonic circuits that incorporate elements as described herein can be operated at significantly reduced power compared to electrically-switched photonic circuits which, as known to a person of skill in the art, already exhibit significantly reduced power as compared to semiconductor circuits. More specifically, a photonic circuit as described herein can be operated, and may perform one or more functions, while consuming only a quantity of electrical power required to generate light that passes through that photonic circuit. In other words, embodiments described herein can be leveraged to create passive optical circuits that are electrically programmable and that, once programmed, do not require electrical power to maintain state or function.

For example, a single bistable optical element as described herein can be programmatically configured to either pass light or to block light. More specifically, once programmed and regardless of electrical power state, the bistable optical element either passes light or blocks light provided to it as optical input. This controllable optical property can be leveraged as a bit of digital memory, a control gate for enabling or disabling other photonic circuit elements optically a coupled to the bistable optical element, a pixel of a no-power digital image, or for any other suitable purpose.

In other examples, an array of bistable optical elements can used to create a nonvolatile digital memory cell or a nonvolatile memory cell array, storing in a durable manner any suitable quantity of digital data.

In yet other examples, bistability may not be required or preferred. For example, a programmable optical element as described herein can be programmatically configured to attenuate light by a particular programmed amount, or switch entirely between outputs. More specifically, once programmed and regardless of electrical power state, the optical element can be configured to attenuate light provided to it by a specified amount. This controllable optical property can be leveraged as a portion of (e.g., a node or a layer of) a trained neural network or other machine learning data structure. More generally and broadly, an array of optical elements as described herein can be programmed to perform—as a passive optical structure—any machine-learned or training-informed computational function.

These structures, which may be referred to herein as "nonvolatile programmable passive optical structures," are particularly useful in low-power applications, such as in edge-compute devices and small electronics (e.g., personal electronics, robotics, drones, Internet-of-Things devices, satellites, and so on).

In other implementations, a nonvolatile programmable passive optical structure as described herein can be used for large-scale, power efficient, data storage.

In yet other examples, a nonvolatile programmable passive optical structure or network thereof can be used in, or as, a trained neural network or other training informed machine learning system configured for one or more of: signal analysis (e.g., Fourier or other transforms, encoding, decoding, modulation, demodulation, encryption, decryption, and so on); cryptographic calculations (e.g., cryptocurrency mining, data encryption or decryption); self-driving; image recognition; voice recognition; drone or robotics command and/or control; global positioning calculations; hardware virtualization; network switching; or for any other suitable computing or control task.

As such, generally and broadly, it may be appreciated that a nonvolatile programmable passive optical structure or network of such structures as described herein can be programmed to optically/physically implement a neural network or other trained machine learning structure or, more generally, any digital or analog logic structure or network of digital or analog logic structures.

Further, a nonvolatile programmable passive optical structure can be used in, or with, any suitable computing resource configured to perform any computational operation or function. As used herein, the term "computing resource" (along with other similar terms and phrases, including, but not limited to, "computing device" and "computing network") may be used to refer to any physical electronic device or machine component, or set or group of interconnected and/or communicably coupled physical electronic devices or machine components, suitable to execute or cause to be executed one or more arithmetic or logical operations on digital data or analog signals.

Example computing resources that incorporate one or more nonvolatile programmable passive optical structures as contemplated herein include, but are not limited to: single or multi-core processors; single or multi-thread processors; purpose-configured co-processors (e.g., graphics processing units, motion processing units, sensor processing units, and the like); configurable logic units (e.g., of field-programmable gate arrays); memory cells; volatile or nonvolatile memory or memory cells or arrays of cells; application-specific integrated circuits; field-programmable gate arrays; input/output devices and systems and components thereof (e.g., keyboards, mice, trackpads, generic human interface devices, video cameras, microphones, speakers, and the like); networking appliances and systems and components thereof (e.g., routers, switches, firewalls, packet shapers, content filters, network interface controllers or cards, access points, modems, and the like); embedded devices and systems and components thereof (e.g., system(s)-on-chip, Internet-of-Things devices, and the like); industrial control or automation devices and systems and components thereof (e.g., programmable logic controllers, programmable relays, supervisory control and data acquisition controllers, discrete controllers, and the like); vehicle or aeronautical control devices systems and components thereof (e.g., navigation devices, safety devices or controllers, security devices, and the like); corporate or business infrastructure devices or appliances (e.g., private branch exchange devices, voice-over internet protocol hosts and controllers, end-user terminals, and the like); personal electronic devices and systems and components thereof (e.g., cellular phones, tablet computers, desktop computers, laptop computers, wearable devices); personal electronic devices and accessories thereof (e.g., peripheral input devices, wearable devices, implantable devices, medical devices and so on); and so on. It may be appreciated that the foregoing examples are not exhaustive.

In view of the foregoing, it may be appreciated that, generally and broadly, a nonvolatile programmable passive optical structure as described herein can be leveraged as a fundamental component of any number of photonic circuits.

As such, for simplicity of description and illustration, the embodiments that follow reference a nonvolatile programmable passive optical structure implemented as a portion of a Mach-Zehnder Interferometer for use as an optical switch, configured to direct light down one of two output paths, depending on the programmed state. In these examples, the nonvolatile programmable passive optical structure is stable relative to each respective output (e.g., configured to pass light or to block light from that output, depending on the programmed state), and may be configured to operate as a digital, nonvolatile optical switch. It is appreciated, however that this is merely one example construction. In other cases, ring resonators or chains thereof can be used in place of or in addition to an interferometer structure.

In this example construction, the nonvolatile programmable passive optical structure has at least one optical input and at least one optical output. At least one of the optical inputs and at least one of the optical outputs are optically coupled to one or more other components of a photonic circuit, which may vary from embodiment to embodiment.

The optical inputs of the nonvolatile programmable passive optical structure can be coupled into a single path and thereafter branched into two arms (of equal length) in order to implement an interferometer structure. The first arm and the second arm are thereafter recombined through a second coupler. As a result of this construction, any phase difference between the first arm and the second arm causes destructive or constructive interferences at the optical outputs, changing relative power output between optical outputs.

A person of skill in the art may readily appreciate that several optical, mechanical, or electrical properties can be leveraged to introduce a phase shift in either the first arm or the second arm, thereby introducing a phase difference between the arms of the interferometer structure, as described above. Examples include the thermo-optic effects, thermal expansion/contraction, optoelectric effects, optional delay loops, and so on.

In other cases, a nonvolatile programmable passive optical structure as described herein can include one or more ring resonators. In these constructions, one or more closed-loop optical waveguides can be positioned/disposed near to one or more other (typically linear, although this is not required) waveguides. Due to proximity between the closed-loop waveguide and the one or more other waveguides, light couples between them. As known to a person of skill in the art, certain frequencies of light (which vary from ring resonator to ring resonator) will constructively interfere on each successive round trip through each closed-loop waveguide, achieving resonance therein. As a result of this construction, both the geometry or optical properties of each ring resonator effect what frequencies of light resonate in each respective ring resonator.

Similarly to foregoing examples, a person of skill in the art may readily appreciate that several optical, mechanical (thermal), or electrical properties can be leveraged to introduce a change in resonant frequency of a ring resonator, as described herein. Examples include the thermo-optic effects, thermal expansion/contraction, optoelectric effects, optional delay loops, and so on.

Embodiments described herein reference methods and structures for leveraging the optoelectric effect (in which presence of an electric field induces a change in effective refractive index of an optical waveguide, thereby imparting a phase shift to light passing therethrough) to introduce a controllable phase difference between two arms of an optical interferometer structure, within a ring resonator, or any other suitable optical structure, such as described above.

Specifically, in these embodiments, one arm of an interferometer structure—or more particularly, at least a portion of one arm of an interferometer structure—is configured to operate as floating gate formed from conductive material that is encapsulated in an insulator, such as silicon dioxide. As a result of this encapsulation, the floating gate can be used to store electrical charge in a nonvolatile way because no electrical path exists for any accumulated charge in the floating gate to dissipate.

Charge can be accumulated in the floating gate, despite that the floating gate is encapsulated by the insulator layer, by quantum tunneling, such as via Fowler-Nordheim tunneling or hot carrier injection across the potential barrier (i.e., insulator) surrounding the floating gate.

More specifically, in many constructions, a source electrode and a control electrode can be disposed over the insulator layer encapsulating the floating gate. As a result of this construction, a voltage of implementation-specific and/or design-specific magnitude applied at the control electrode can induce one or more charge carriers to tunnel through the insulator layer between the source electrode and the floating gate, and accumulate or reduce charge carriers in the floating gate.

Similarly, applying an opposite voltage at the control electrode can induce one or more charge carriers to tunnel in the opposite direction between the floating gate and the source electrode, thereby changing the charge state of the floating gate again.

For convention herein, applying a signal to the control electrode that induces the charge state of the floating gate to change to a specified/desire value may be referred to a "write" operation or a "programming" operation. Similarly, applying signal to the control electrode that induces the charge state of the floating gate to change to a default value may be referred to herein an "erase" operation or a "reset" operation.

As noted above, the floating gate can, in many implementations, be optically coupled to one arm of an interferometer structure. In another phrasing, a floating gate can also serve as an optical waveguide in the optical path defined by one arm of an interferometer structure.

As a result of this architecture—in which an optical waveguide is also a floating gate configured to accumulate charge and retain that charge in a nonvolatile manner—a phase shift will be imparted in the first arm in proportion to the accumulated charge of the floating gate. The accumulated charge, in turn, results in a phase difference between the first and second arms of the interferometer structure which, in turn, destructively interferes at the optical output of the nonvolatile programmable passive optical structure. By selecting a size and/or charge state of the floating gate to impart a 180° phase difference, the optical interferometer structure can be used as a nonvolatile bistable switch element; in a first charge state, light passes through the optical interferometer structure whereas in a second charge state, light destructively interferes and does not pass through the optical interferometer structure. In other constructions, an optical interferometer structure can include multiple optical outputs; in such examples, a first charge state light passes through to a first output and in a second charge state, light passes through to a second output. In yet other examples, intermediate charge states can each be associated with different optical power output from each output.

As such, more generally and broadly, embodiments described herein can take the form of a semiconductor device including at least a source electrode, a control electrode, an insulator layer, and a floating gate separated from the source electrode and the control electrode by the insulator layer. For constructions described herein, the floating gate is an optical waveguide optically coupled to, or into, a photonic circuit.

In these constructions, the floating gate can be charged or discharged (programmed or erased) through the insulator layer via quantum tunneling (e.g., Fowler-Nordheim tunneling and/or hot carrier injection). As a result of electrical isolation of the floating gate due to the insulator layer, the floating gate retains its charged or uncharged state in a nonvolatile manner.

As noted above, for these constructions, the floating gate also functions as an optical waveguide. As a result of the optoelectric effect, the refractive index of the optical waveguide/floating gate is different between a charged state or an uncharged state of the floating gate. Further, because the charged state or uncharged state of the floating gate is nonvolatile, the effective index of refraction of the optical waveguide is also modifiable/mutable nonvolatile manner. In this way, the optical waveguide can function as a portion of a nonvolatile optical switch, such as described above.

It may be appreciated, that a nonvolatile programmable passive optical structure can be included in a number of photonic circuits and/or semiconductor circuits for any number of optical or electrical purposes or functions. For example, as noted above, an interferometer structure is merely one example optical structure that can leverage the methods and techniques described herein. In a ring resonator construction, one or more closed-loop waveguides (rings) can be implemented as a floating gate, as described herein. In other constructions, a portion of a closed-loop waveguide can pass through and/or be optically coupled to a floating gate/optical waveguide as described herein.

Furthermore, in some example constructions, a semiconductor device that includes a nonvolatile programmable passive optical structure as described herein (including at least one floating gate that doubles as an optical waveguide) can also include a drain gate. In these example constructions, the electrical field generated by charge accumulated in the floating gate can measured electrically or optically by determining electrical characteristics of voltage differences between the drain and the source. In other words, in these constructions, the floating gate can be operated as optical memory or as electrical memory (e.g., flash memory).

In some implementations, operating a control gate to accumulate charge in the floating gate/waveguide during a write operation may be a time-consuming process; in such examples, the nonvolatile programmable passive optical structure may be electrically readable via the drain gate before becoming optically readable via a photonic circuit optically coupled thereto. In these constructions, different read operations (i.e., electrical and optical) may be leveraged to improve overall performance. For example, electrical read may be performed until the floating gate is sufficiently charged to effect an optical read operation. A person of skill in the art may appreciate that many different read and write techniques, whether electrical or optical are possible.

These and other constructions including a nonvolatile programmable passive optical structure are discussed below with reference to FIGS. 1-6. However, those skilled in the art will readily appreciate that the detailed description given herein with respect to these figures is for explanation only and should not be construed as limiting.

Generally and broadly, FIGS. 1-3E depict and/or relate to an example semiconductor structure that can include a nonvolatile programmable passive optical structure, such as described herein. For simplicity of description and illustration, the nonvolatile programmable passive optical structure depicted and described is implemented as a nonvolatile memory cell or nonvolatile optical switch, but as noted above, this is merely one example construction and other implementations are possible.

FIG. 1 depicts a simplified cross section of a nonvolatile programmable passive optical structure 100 for a photonic circuit, such as described herein. The nonvolatile programmable passive optical structure 100 can be included as a portion of any suitable electronic or photonic circuit.

The nonvolatile programmable passive optical structure 100 includes an optical waveguide 102. The optical waveguide 102 can be a rib waveguide or, may take any suitable optical waveguide shape. The optical waveguide 102 can be formed from any suitable material although in many embodiments, crystalline silicon may be used. As such, in many examples, the optical waveguide 102 is a silicon optical waveguide.

The optical waveguide 102 is embedded in an insulator layer 104, which may be a silicon oxide, such as silicon dioxide. Thicknesses of cladding/encapsulation of the optical waveguide 102 may vary from location to location and embodiment to embodiment.

The optical waveguide 102 can include a rib portion and two wing portions, extending from the rib portion. The rib portion is depicted in the center of the optical waveguide 102, but this may not be required of all embodiments. In some examples, the optical waveguide 102 may be offset relative to the depicted position.

The optical waveguide 102 can be formed using any suitable technique. In some examples, the optical waveguide 102 is formed over a silicon oxide region of an initial substrate. In other cases, the optical waveguide 102 can be formed in a first process, after which the insulator layer 104 is formed around the optical waveguide 102. A person of skill in the art may readily appreciate that any suitable silicon manufacturing or micromachining technique can be used to form one or more features of the optical waveguide 102 and dispose the optical waveguide 102 within the insulator layer 104.

The nonvolatile programmable passive optical structure 100 further includes a control electrode 106 and a source electrode 108, each formed form a conductor or semiconductor material such as polycrystalline silicon. The control electrode 106 can be separated from (e.g., electrically decoupled from) the optical waveguide 102 by a dielectric layer 110, and the source electrode 108 can be separated from (e.g., electrically decoupled from) the optical waveguide 102 by a dielectric layer 112.

In some examples, the dielectric layer 110 and the dielectric layer 112 can be formed from a silicon oxide. In further cases, the dielectric layer 110 and the dielectric layer 112 can be formed from the same material as the insulator layer 104.

In some embodiments the dielectric layer 110 and the dielectric layer 112 can be formed to different thicknesses; in typical implementations, the dielectric layer 110 can be formed to a greater thickness than the dielectric layer 112, but this may not be required of all embodiments.

In other cases, the dielectric layer 110 and the dielectric layer 112 may be formed from different materials or different combinations of materials. In one embodiment, the dielectric layer 110 is formed as a layered substrate including a first section/layer of a silicon oxide, a second section/layer formed form a silicon nitride, and a third section/layer formed from a silicon oxide.

In a more specific phasing, a first layer of silicon oxide can be formed to interface a wing region of the optical waveguide 102, a layer of a silicon nitride can be formed to interface the first layer of silicon nitride, and a second layer of silicon oxide can be formed to interface the silicon nitride layer and the control electrode 106.

As with the optical waveguide 102, the dielectric layer 110, the dielectric layer 112, the control electrode 106, and the source electrode 108 can all be formed in a number of suitable ways, to any number of suitable thicknesses, from any number of suitable materials, and so on. It may be appreciated that the illustrated cross section is merely one simplified example.

In many cases, the control electrode 106 and the source electrode 108 and each respective dielectric layer separating the electrodes from the optical waveguide 102, are also encapsulated within the insulator layer 104. This architecture may be selected to passivate the control electrode 106 and the source electrode 108 and prevent corrosion damage thereto.

Each of the control electrode 106 and the source electrode 108 can be conductively coupled to one or more metallized portions, such as the metallized region 114 and the metallized region 116. In some examples, the control electrode 106 can include an extended portion 106a to which the metallized region 116 extends through a via to conductively couple to the control electrode 106. Similarly, the source electrode 108 can include an extended portion 108a to which the metallized region 114 extends through a separate via to conductively couple to source electrode 108. The metallized portions can be formed from any suitable metals such as gold or aluminum.

The nonvolatile programmable passive optical structure 100 can be coupled to an electrical circuit configured to perform one or more write or erase operations. In particular, the electrical circuit—which may be referred to as a state controller—may be configured to apply a voltage signal of design-specific or implementation-specific magnitude relative to system ground, to the control electrode 106 via the metallized region 116.

When the voltage signal is applied, one or more charge carriers may be induced to tunnel through the dielectric layer 112 between the optical waveguide 102 and the source electrode 108. In these examples, the voltage may be selected such that the charge carriers induced to move to the optical waveguide 102 may not be able to further tunnel through the dielectric layer 110. As a result, the tunneled charge carriers become effectively trapped within the optical waveguide 102 of the nonvolatile programmable passive optical structure 100. In this manner, the optical waveguide 102 functions as a floating gate, such as described above.

When voltage is removed from the control electrode 106, charge remains in the optical waveguide 102, effecting the refractive index thereof. In some cases, the optical waveguide 102 can include a doping pattern that induces any charge carriers in the optical waveguide 102 to concentrate in a particular region of the optical waveguide 102, such as in the rib region of the optical waveguide 102; this is not required of all embodiments.

As a result of the depicted construction, it may be understood that charge state of the optical waveguide 102 is a mutable nonvolatile property that does not require power to maintain. In turn, because the charge state influences the index of refraction of the optical waveguide 102 by the optoelectric effect, the index of refraction of the optical waveguide is also a mutable nonvolatile property that does not require power to maintain.

In this manner, the depicted structure is a nonvolatile passive optical structure having at least one optical property that is electrically programmable.

The foregoing embodiment depicted in FIG. 1 and the various alternatives thereof and variations thereto are presented, generally, for purposes of explanation, and to facilitate an understanding of various configurations and constructions of a nonvolatile programmable passive optical structure, such as described herein. However, it will be apparent to one skilled in the art that some of the specific details presented herein may not be required in order to practice a particular described embodiment, or an equivalent thereof.

For example, in other embodiments, proportions and relative dimensions of the layers of the nonvolatile programmable passive optical structure 100 may vary. In some cases, the wing regions of the optical waveguide may extend farther than shown; in other cases, the rib portion of the optical waveguide may take a different shape.

Further, it may be appreciated that the structure shown in FIG. 1 may be implemented to any suitable scale. In many embodiments, the structure may be a micrometer-scale structure, having a width of approximately 5 μm and a height of less than 1 μm. In other cases, other scales, cross-sectional profiles, relative sizes of different elements and layer thicknesses, and so on may be used.

In some cases, the optical waveguide may extend in a linear fashion (in or out of the page), whereas in other cases, the optical waveguide may be at least partially curved. In some cases, the optical waveguide may be optically coupled to one or more photonic circuits.

Furthermore, as noted above, one or more dimensions or dimensional properties of an optical waveguide as described herein may be selected to impart—when exhibiting a particular charge—a 180° phase shift relative to another parallel waveguide, such as may be included in an interferometer structure. In these examples, a charged state of the optical waveguide/floating gate corresponds to fully destructive interference (i.e., no light passing through the interferometer structure), whereas an uncharged state of the optical waveguide/floating gate corresponds to fully in-phase, constructive interference (i.e., passing light through the interferometer structure). In other constructions, light can selectively pass between different outputs based on different charge states.

In yet other examples, the silicon nitride layer disposed between the optical waveguide and the control gate can be leveraged as a second waveguide, coupled to a different (or the same) photonic circuit. In other cases, the silicon nitride layer may be disposed to a thickness unsuitable for waveguide operation.

In such embodiments, the floating gate/optical waveguide should be electrically decoupled from any electrical circuit or path to circuit or system ground, so that the floating gate/optical waveguide can maintain its charged state in a non-volatile manner.

Figure 2A:
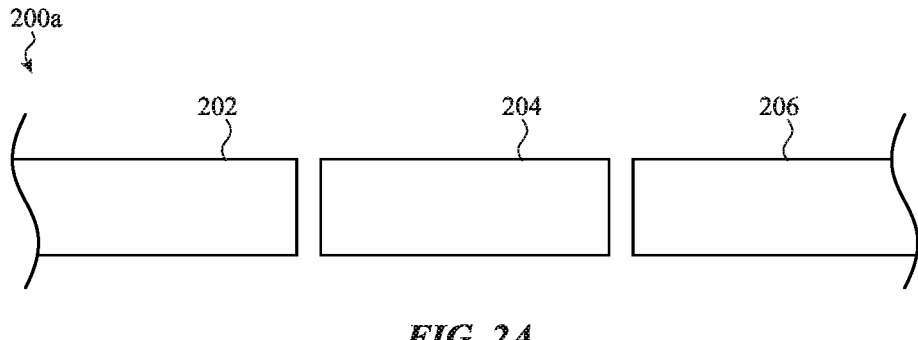
FIGS. 2A-2B each depict a simplified schematic view of an optical waveguide that may optically couple to a nonvolatile programmable passive optical structure for a photonic circuit, such as described herein.

In one example construction, a waveguide optically coupling to a waveguide of a nonvolatile programmable passive optical structure as described herein can be segmented, such as shown in FIG. 2A. In this embodiment, a waveguide 200a can include a first segment 202 that is electrically decoupled from a second segment 204, that is in turn electrically decoupled from a third segment 206. In this example construction, each of the segments can be optically coupled due to relative proximity, while remaining conductively decoupled. More specifically, each of the illustrated segments can be separated by an insulator such as a silicon oxide. In this example, the second segment 204 may be a floating gate/optical waveguide of a nonvolatile programmable passive optical structure, such as a described herein.

Figure 2B:
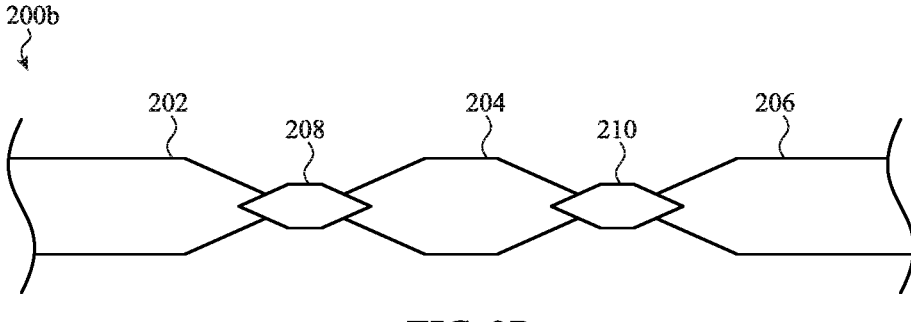

In another example, an optical coupling can be formed by out-of-pane adiabatic tapers. FIG. 2B depicts a waveguide 200b that can include a first segment 202 that is electrically decoupled from a second segment 204, that is in turn electrically decoupled from a third segment 206, as with the embodiment shown in FIG. 2A. In this example construction, however, each of the segments include at least one adiabatic taper that overlaps with an optical jumper, such as the optical jumper 208 and 210. More specifically, the optical jumpers 208, 210 can also include corresponding adiabatic tapers and can be formed and/or disposed out of plane with the segments of the waveguide 200b. In this manner, light can pass through the waveguide 200b, crossing between different layers of material via overlapping adiabatic tapers. In this example, as with the embodiment shown in FIG. 2A, the various segments of the waveguide 200b are optically coupled, but conductively decoupled. More specifically, each of the illustrated segments can be separated by an insulator such as a silicon oxide. As with the embodiment shown in FIG. 2A, in this example, the second segment 204 may be a floating gate/optical waveguide of a nonvolatile programmable passive optical structure, such as a described herein.

These foregoing embodiments depicted in FIGS. 1-2B and the various alternatives thereof and variations thereto are presented, generally, for purposes of explanation, and to facilitate an understanding of various configurations and constructions of a nonvolatile programmable passive optical structure that includes a floating gate/optical waveguide, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

For example, generally and broadly, it may be appreciated that a nonvolatile programmable passive optical structure such as described in reference to FIGS. 1-2B can be implemented in any number of suitable ways. In some examples, a source electrode can be positioned along or overlapping an edge of an optical waveguide/floating gate. In some examples, a control electrode can be positioned along or overlapping an edge of an optical waveguide/floating gate. In some cases, a control electrode can be positioned on one face of an optical waveguide (e.g., a bottom face) whereas a source electrode can be positioned on an opposite face of the same waveguide. In some cases, more than one optical waveguide/floating gate can be associated with the same control electrode/source electrode pair. In some cases, as noted above, a drain electrode can also be included to impart both electrical and optical read functionality to the nonvolatile programmable passive optical structure.

Figure 3A:
FIGS. 3A-3E each depict a simplified system diagram of a nonvolatile programmable passive optical structure for a photonic circuit, as described herein.
Figure 3A:
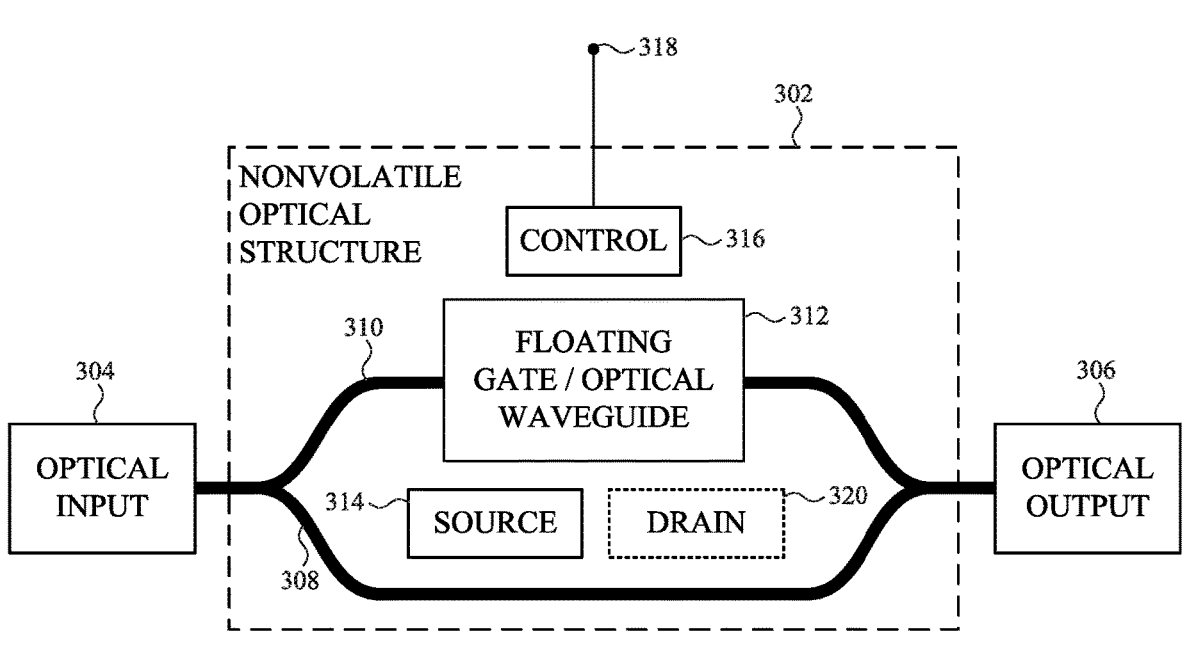

FIG. 3A depicts a system diagram 300a of a nonvolatile programmable passive optical structure for a photonic circuit, as described herein. The nonvolatile programmable passive optical structure 302 receives light from an optical input 304 and provides output to further photonic elements or circuits via an optical output 306.

The nonvolatile programmable passive optical structure 302 is depicted as implementing an interferometer structure, although this is not required of all embodiments. In other cases, ring resonators, delay loops, and other optical waveguides or optical/photonic structures can be included.

The interferometer structure is defined by a split or bifurcation of the optical input 304 into a first arm 308 and a second arm 310. The first arm 308 may also be referred to as the reference arm and the second arm may also be referred to as a mutable arm.

In this example, the second arm 310 is configured to optically couple through a floating gate/optical waveguide 312 that may be configured as described above with reference to FIGS. 1-2B. The floating gate/optical waveguide 312 may be fully encapsulated in an insulator layer, such as a silicon oxide. Nevertheless, the floating gate/optical waveguide 312 may be optically coupled to the second arm 310.

The floating gate/optical waveguide 312 may be formed adjacent to a source electrode 314 and a control electrode 316, which may be configured to operate as described above. More particularly, in this construction, when a voltage signal—such as a programming signal or an erase signal—is received by the nonvolatile programmable passive optical structure 302 at a signaling input 318, the control electrode 316 can be driven to a specified voltage which, in turn, can cause charge to accumulate in the floating gate/optical waveguide 312 due to tunneling through the insulator layer separating the source electrode 314 from the floating gate/optical waveguide 312.

Once charge is accumulated in the floating gate/optical waveguide 312, an effective group refractive index of the second arm 310 is changed, which in turn changes the phase of light passing through the second arm 310 relative to the reference arm.

As a result, when light passing through the mutable arm is recombined with light passing through the reference arm prior to the optical output 306, the difference in phase results in destructive interference, attenuating light output from the optical output 306 relative to an amplitude of light provided as input to the optical input 304. As noted above, by controlling the dimensions (e.g., length, width, shape, and so on) of the floating gate/optical waveguide 312 and the charge applied thereto, any suitable phase difference can be achieved, including a 180° phase difference which, as known to a person of skill in the art, effectively prevents any light from passing through the optical output 306.

In this manner, the nonvolatile programmable passive optical structure 302 can be used as a nonvolatile, low-power, optical memory cell or nonvolatile optical switch.

These foregoing embodiments depicted in FIGS. 1-3A and the various alternatives thereof and variations thereto are presented, generally, for purposes of explanation, and to facilitate an understanding of various configurations and constructions of a nonvolatile programmable passive optical structure, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

For example, as noted above, in some examples a drain electrode 320 can also be included. Measuring a voltage between the drain electrode 320 and the source electrode 314 can probe a charge state of the floating gate/optical waveguide 312. In this manner, the drain electrode 320 can be used to verify that charge has been correctly applied to the floating gate/optical waveguide 312 and/or as an electronic bit of digital memory. In another, non-limiting phrasing, the drain electrode can be used as a redundant electrical method of determining the nonvolatile charge state of the floating gate/optical waveguide 312. In some cases, this may improve the apparent speed at which a memory cell as described herein operates; in a first mode, while the floating gate/optical waveguide is charging and/or being programmed, the drain electrode 320 may be used as a digital non-volatile bit in a semiconductor circuit. Once the floating gate is fully charged, the drain electrode 320 may be no longer required and/or used; the circuit may be read optically only thereafter. It may be appreciated that these constructions are mere examples; in other cases, other methods and/or mutual electrical and optical operations may be performed with a structure as described and depicted herein.

Figure 3B:
Figure 3B:
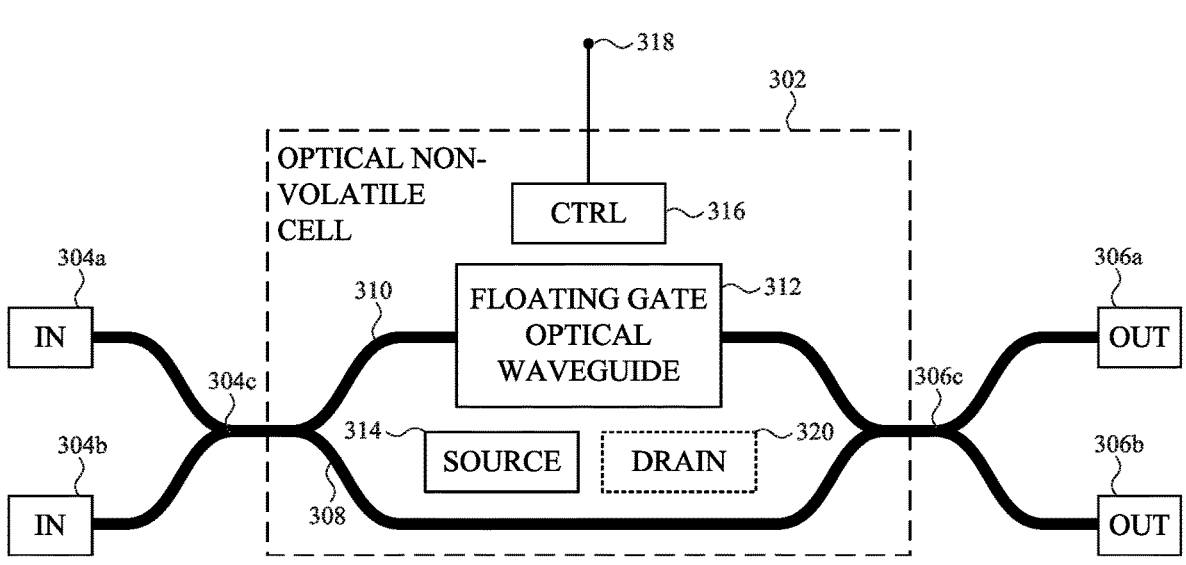

Furthermore, as noted above, in some cases an interferometer structure with multiple inputs and multiple outputs can be constructed. For example, as with other embodiments presented herein, FIG. 3B depicts a system diagram 300*b* of a nonvolatile programmable passive optical structure for a photonic circuit, as described herein. The nonvolatile programmable passive optical structure 302 receives light from the optical inputs 304*a*, 304*b* and provides output to further photonic elements or circuits via an optical outputs 306*a*, 306*b*. The optical inputs 304*a*, 304*b* can be coupled together at a junction, also referred to as a coupler 304*c*.

As with the embodiment shown in FIG. 3A, the interferometer structure depicted in FIG. 3B can include a split or bifurcation of an output of the coupler 304*c* into a first arm 308 and a second arm 310. The first arm 308 may also be referred to as the reference arm and the second arm may also be referred to as a mutable arm, control arm, floating gate arm, and so on.

In this example, as with other examples presented herein, the second arm 310 is configured to optically couple through a floating gate/optical waveguide 312 that may be configured as described above with reference to FIGS. 1-3A. The floating gate/optical waveguide 312 may be fully encapsulated in an insulator layer, such as a silicon oxide, electrically decoupling the floating gate/optical waveguide 312 from other electrical components. Although conductively decoupled from other circuitry or path(s) to ground, the floating gate/optical waveguide 312 may be optically coupled to (or into) the second arm 310.

The floating gate/optical waveguide 312 may be formed adjacent to a source electrode 314 and a control electrode 316, which may be configured to operate as described above. More particularly, in this construction, when a voltage signal—such as a programming signal or an erase signal—is received by the nonvolatile programmable passive optical structure 302 at a signaling input 318, the control electrode 316 can be driven to a specified voltage which, in turn, can cause charge to accumulate in the floating gate/optical waveguide 312 due to tunneling through the insulator layer separating the source electrode 314 from the floating gate/optical waveguide 312.

Once charge is accumulated in the floating gate/optical waveguide 312, an effective group refractive index of the second arm 310 is changed, which in turn changes the phase of light passing through the second arm 310 relative to the reference arm.

As a result, when light passing through the mutable arm is recombined by a second coupler 306c with light passing through the reference arm prior to the optical outputs 306a, 306b, the difference in phase results in destructive or constructive interference, dividing power of light input to the optical inputs 304a, 304b between the optical outputs 306a, 306b in a ratio related to the charge state of the floating gate/optical waveguide 312. As noted above, by controlling the dimensions (e.g., length, width, shape, and so on) of the floating gate/optical waveguide 312 and the charge applied thereto via programming, any suitable phase difference between the first arm 308 and the second arm 310 can be achieved, and thus different power output can be provided via each optical output of the optical outputs 306a, 306b.

In this manner, the nonvolatile programmable passive optical structure 302 can be used as a nonvolatile, low-power, optical memory cell, optical hidden layer nodes of a trained neural network, nonvolatile optical switch, and so on.

As with the embodiment shown in FIG. 3A, the optical structure shown in FIG. 3B can also optionally include a drain electrode 320, configured as described above or in another suitable manner. This description is not repeated.

These foregoing embodiments depicted in FIGS. 3A-3B and the various alternatives thereof and variations thereto are presented, generally, for purposes of explanation, and to facilitate an understanding of various configurations and constructions of a nonvolatile programmable passive optical structure, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 3C:
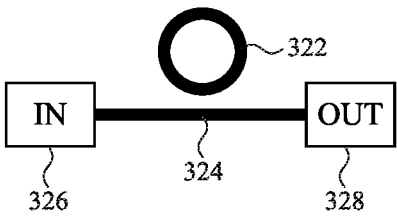
Figure 3D:
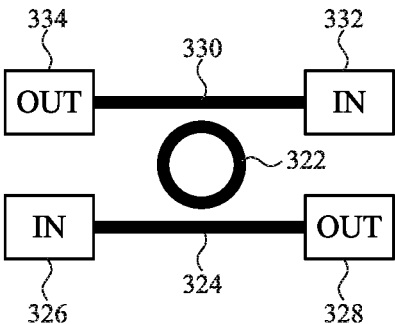
Figure 3E:
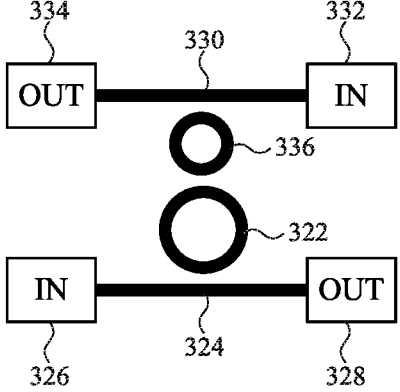

For example, as noted above, in some cases optical structures that are not interferometer structures can be used. As one example, a ring resonator may be used. FIGS. 3C-3E depict example ring resonator constructions.

FIG. 3C depicts a ring resonator 322. The ring resonator 322 is positioned to optically couple to a waveguide 324 that receives light from an input 326 and provides light as output through an output 328. As known to a person of skill in the art, optical and mechanical properties of the ring resonator 322 define what frequencies resonate through successive trips round the ring resonator 322. For example, larger ring resonators (having a larger radius or defining a longer path) resonate at different low frequencies than smaller ring resonators. In addition, differently structured ring resonators may resonate with different harmonics. As known to a person of skill in the art, heaters may be used to change one or more dimensions of a ring resonator by thermal expansion. For simplicity of description and illustration FIG. 3C is depicted without heating elements that may be used in certain embodiments.

In addition to, or in place of, changing one or more mechanical properties of a ring resonator, such as the ring resonator 322, the ring resonator 322 may be a floating gate/optical waveguide such as described herein. More specifically, the ring resonator 322 may be electrically decoupled from other circuitry (and system and circuit ground) but optically coupled to the waveguide 324. In this manner, as with other optical structures described herein, a charge state of the ring resonator 322 defines what frequencies resonate through the ring resonator 322 and, thus, what frequencies are filtered and/or reflected within the waveguide 324 as a result of optical coupling with the ring resonator 322.

In some constructions, the ring resonator 322 can optically couple to multiple waveguides. For example, as shown in FIG. 3D, the ring resonator 322—which may also be and/or may be optically coupled to a floating gate/waveguide, as described herein—can be optically coupled to (e.g., positioned close to) a second waveguide 332 that receives optical input via a second optical input 332 and provides output via a second optical output 334. In some cases, optical input via the second optical input 332 may not be required; light from the first waveguide—the waveguide 324—may couple into the ring resonator 322, resonate at one or more frequencies, and couple into the second waveguide 330. In these constructions, very specific and narrow bands of light (e.g., light at particular frequencies) can be passed to the second output 334. In these constructions, as described above in reference to FIG. 3C, the ring resonator 322 can be, or can be optically coupled to, a floating gate/waveguide as described herein. In this manner, a charge state of the ring resonator 322 which may be established via programming as described above, defines what frequencies of light are output by the second output 334, what frequencies of light are filtered from the output 328, and/or what frequencies of light are reflected back in a direction opposite of the input 326. By changing the charge state, power output and frequency output from each optical output can be precisely controlled and maintained in a non-volatile manner.

In yet other cases, multiple ring resonators can be chained and/or optically coupled together. For example, as shown in FIG. 3E, a second ring resonator 336 can be optically coupled to the ring resonator 322. In this construction, a higher-frequency harmonic that resonates within the first ring resonator 322 can be coupled into the second ring resonator 336 and, in turn, coupled into the second waveguide 330.

In some cases, a floating gate/waveguide as described herein can be used with one or more other control elements, such as heating elements and the like.

Further still, in some cases, multiple nonvolatile programmable passive optical structures can be combined to create higher-order programmable optical structures. For example, as noted above, in some embodiments, multiple nonvolatile programmable passive optical structures can be arranged in an optical network and can each be uniquely programmed to impart different attenuation (a different phase difference resulting from different programming) corresponding to different hidden layer nodes of a trained neural network.

Figure 4:
FIG. 4 depicts a field-programmable gate array that can leverage one or more nonvolatile programmable passive optical structures for photonic circuits as described herein.
Figure 4:
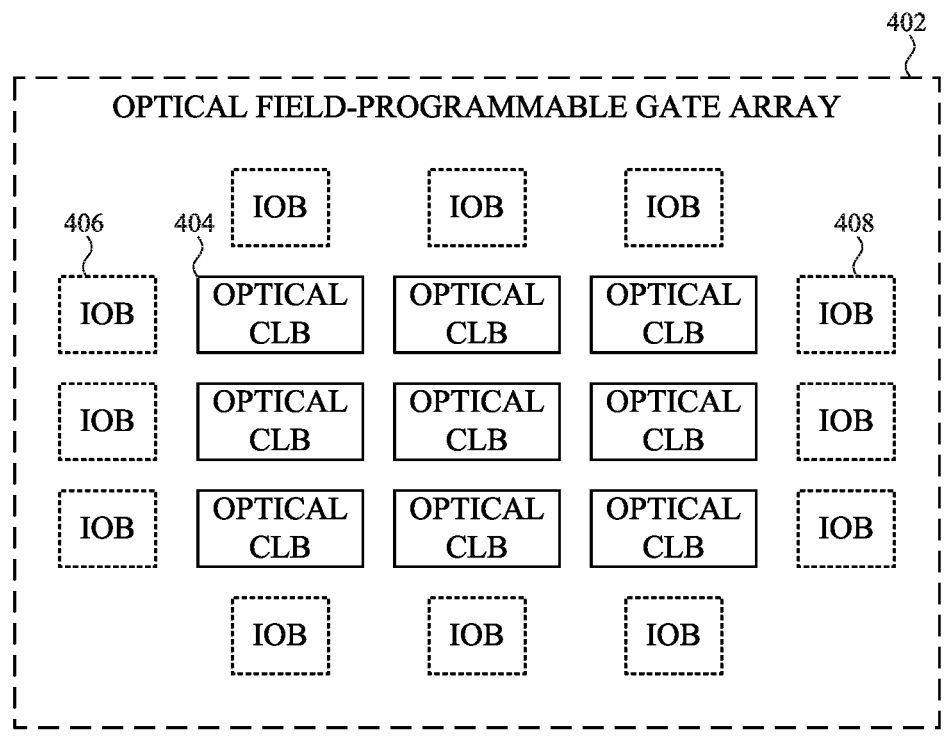

In other embodiments, a nonvolatile programmable passive optical structure as described herein can be used to store a configuration variable or parameter for a configurable logic block or input output block of a field-programmable gate array. FIG. 4 depicts a simplified system diagram 400 of a field-programmable gate array 402 that can leverage one or more nonvolatile programmable passive optical structures for photonic circuits, as described herein.

In particular, in the depicted construction, an array of optical configurable logic blocks, one of which is identified as the configurable logic block 404, can be implemented, each with at least one nonvolatile programmable passive optical structure as described herein. In some examples, optical signal routing between different optical configurable logical blocks can be controlled by a bistable programmable passive optical structure, such as described above. In other cases, one or more input/output blocks such as the input/output blocks 406, 408 can include at least one nonvolatile programmable passive optical structure as described herein.

In yet other implementations, a nonvolatile programmable passive optical structure can be used for other photonic and/or electronic circuits. For example, in one construction, an array of nonvolatile programmable passive optical structures can be coupled together to form a nonvolatile optical memory array. In particular, sets of nonvolatile programmable passive optical structures, each defining a discrete memory cell, can be mutually controlled via word line and bit line control paradigms used to control blocks of memory cells in conventional flash memory implementations.

Figure 5:
FIG. 5 is a flowchart depicting example operations of a method of operating a nonvolatile programmable passive optical structure, such as described herein.
Figure 5:
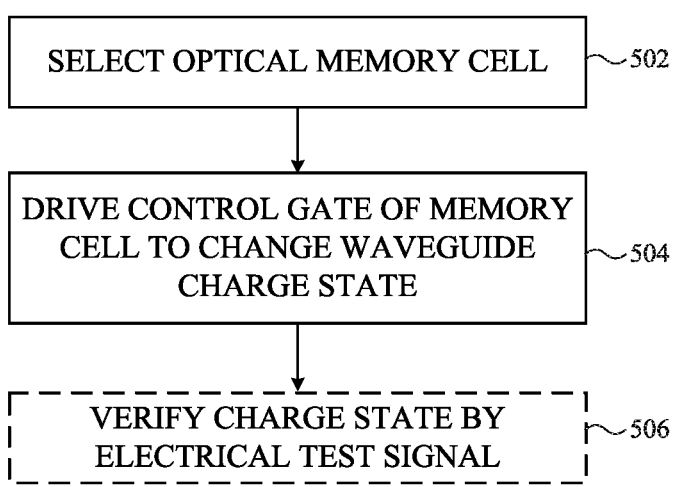

For example, FIG. 5 is a flowchart depicting example operations of a method of operating a nonvolatile programmable passive optical structure as a memory cell, such as described herein. The method 500 includes operation 502 at which a particular memory cell is selected from a group of memory cells. The memory cell may be selected by address, in some examples.

The method further includes operation 504 in which a control gate or control electrode associated with the memory cell can be driven to a particular voltage to change the charge state of a floating gate/waveguide associated with the memory cell.

Optionally, the method 500 can further include operation 506 at which a drain electrode/gate can be leveraged together with a source electrode/gate to electrically determine a charge state of the floating gate/waveguide. This may not be required of all embodiments.

Figure 6:
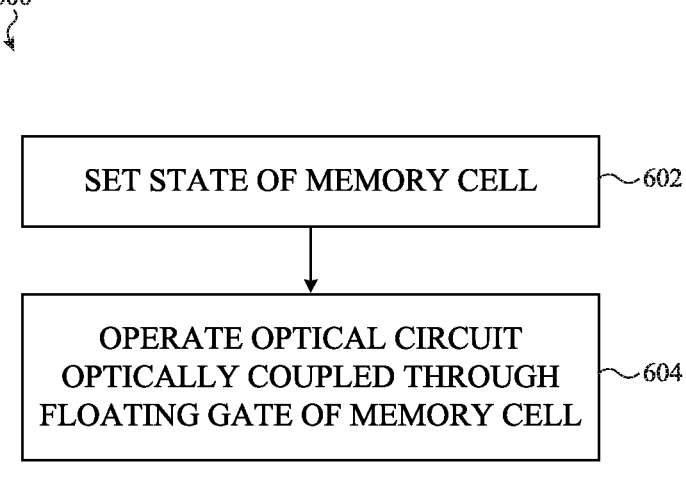
FIG. 6 is a flowchart depicting example operations of a method of operating a nonvolatile programmable passive optical structure with a photonic circuit, such as described herein.

FIG. 6 is a flowchart depicting example operations of a method of operating a nonvolatile programmable passive optical structure with a photonic circuit, such as described herein. The method 600 includes operation 602 at which a particular memory cell is selected from a group of memory cells, such as by addressing. In addition, the selected memory cell is programmed to a particular charge state or, more generally, set to a particular digital value. Next, at operation 604, an optical circuit or photonic circuit optically coupled through a floating gate/waveguide of the memory cell can be operated. More simply, light can be passed through the floating gate, which may be affected by the charge state set at operation 602.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

As used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

What is claimed is:

1. A semiconductor device comprising:
a source electrode;
a control electrode;
an insulator layer; and
a floating gate separated from the source electrode and the control electrode by the insulator layer, the floating gate optically coupled to and electrically isolated from a photonic circuit and configured to operate as a waveguide of the photonic circuit, the floating gate operable to accumulate electrical charge across the insulator layer via quantum tunneling.

2. The semiconductor device of claim 1, wherein the insulator layer comprises a first portion separating the source electrode from the floating gate and a second portion separating the control electrode from the floating gate.

3. The semiconductor device of claim 2, wherein the second portion of the insulator layer is an oxide-nitride-oxide dielectric layer.

4. The semiconductor device of claim 1, wherein the floating gate comprises a silicon optical waveguide.

5. The semiconductor device of claim 1, further comprising a drain electrode separated from the floating gate by the insulator layer.

6. The semiconductor device of claim 1, wherein the photonic circuit comprises an interferometer or a ring resonator.

7. The semiconductor device of claim 6, wherein the interferometer is a Mach-Zehnder interferometer.

8. The semiconductor device of claim 6, wherein the interferometer comprises:
a first arm; and
a second arm including the floating gate.

9. A semiconductor device comprising:
a conductive element;
a layered dielectric disposed below the conductive element, the layered dielectric comprising:
a first silicon oxide layer formed to interface the conductive element;
a silicon nitride layer formed to interface the first silicon oxide layer; and
a second silicon oxide layer formed to interface the silicon nitride layer;
a silicon waveguide formed to interface the second silicon oxide layer of the layered dielectric, the silicon waveguide:
optically coupled to a photonic circuit; and conductively decoupled from the conductive element, thereby operating as a floating gate; wherein:

in response to a voltage applied to the conductive element, the silicon waveguide accumulates charge by quantum tunneling, the accumulated charge effecting a change in a refractive index of the silicon waveguide.

10. The semiconductor device of claim 9, wherein the silicon waveguide is a first waveguide and the silicon nitride layer is a second waveguide.

11. The semiconductor device of claim 9, wherein the silicon waveguide is the floating gate of a memory cell of which the conductive element is a control gate.

12. The semiconductor device of claim 11, wherein the memory cell comprises a source gate separated from the silicon waveguide by an insulator layer, the source gate configured to supply the charge accumulated by the silicon waveguide in response to the voltage applied to the control gate.

13. The semiconductor device of claim 9, wherein:

the photonic circuit comprises an interferometer defining a first optical path and a second optical path; and the silicon waveguide is optically coupled into the first optical path.

14. The semiconductor device of claim 9, wherein the silicon waveguide comprises a first end defining a first adiabatic taper and a second end defining a second adiabatic taper.

15. A nonvolatile semiconductor memory comprising:

an array of memory cells, each memory cell comprising:

a source gate;

a control gate;

an optical input;

an optical output;

a first waveguide defining a first optical path optically coupling the optical input to the optical output; and a second waveguide defining a second optical path optically coupling the optical input to the optical output, the second waveguide conductively decoupled from the source gate and the control gate, and configured to accumulate and retain, via quantum tunneling, electrical charge supplied by the source gate in response to a voltage applied to the control gate such that the second optical path exhibits a different index of refraction from the first optical path.

16. The nonvolatile semiconductor memory of claim 15, wherein:

a subset of the array of memory cells are conductively coupled by a word line; and each memory cell of the subset of the array are conductively coupled to a respective one bit line.

17. The nonvolatile semiconductor memory of claim 15, further comprising a light source optically coupled to a respective optical input of at least one memory cell of the array of memory cells.

18. The nonvolatile semiconductor memory of claim 15, wherein the first waveguide and the second waveguide define a Mach-Zehnder interferometer.

19. The nonvolatile semiconductor memory of claim 15, wherein at least one memory cell of the array of memory cells is a portion of a configurable logic block of a field programmable gate array.

* * * * *